(12) United States Patent
Boemler

(10) Patent No.: US 7,633,794 B2
(45) Date of Patent: Dec. 15, 2009

(54) STATIC RANDOM ACCESS MEMORY CELL

(75) Inventor: Christian Boemler, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 296 days.

(21) Appl. No.: 11/713,059

(22) Filed: Feb. 28, 2007

(65) Prior Publication Data

US 2007/0147108 A1   Jun. 28, 2007

Related U.S. Application Data

(62) Division of application No. 11/113,365, filed on Apr. 21, 2005, now Pat. No. 7,321,504.

(51) Int. Cl.
*G11C 11/00* (2006.01)
(52) U.S. Cl. .................. 365/154; 365/156; 365/189.14; 365/189.15; 365/230.05
(58) Field of Classification Search ................. 365/154, 365/156, 230.05, 189.14, 189.15, 189.16
See application file for complete search history.

(56) References Cited

U.S. PATENT DOCUMENTS

| | | | | |
|---|---|---|---|---|
| 4,441,169 A | * | 4/1984 | Sasaki et al. ................. | 365/190 |
| 4,779,231 A | * | 10/1988 | Holzapfel et al. ............ | 365/156 |
| 4,876,669 A | | 10/1989 | Yamamoto et al. ...... | 365/189.01 |
| 4,956,815 A | | 9/1990 | Houston ....................... | 365/154 |
| 4,972,377 A | | 11/1990 | Lee .............................. | 365/226 |
| 5,212,663 A | | 5/1993 | Leong .................... | 365/189.01 |
| 5,353,251 A | * | 10/1994 | Uratani et al. .......... | 365/189.05 |
| 5,473,574 A | | 12/1995 | Clemen et al. .......... | 365/230.05 |
| 5,506,805 A | | 4/1996 | Hirose et al. ................ | 365/194 |
| 5,515,326 A | | 5/1996 | Hirose et al. ............ | 365/189.11 |
| 5,991,192 A | | 11/1999 | Wang et al. .................. | 365/154 |
| 6,104,045 A | | 8/2000 | Forbes et al. ................. | 257/141 |
| 6,172,899 B1 | | 1/2001 | Marr et al. .................... | 365/154 |
| 6,173,379 B1 | | 1/2001 | Poplingher et al. .......... | 711/165 |
| 6,181,608 B1 | | 1/2001 | Keshavarzi et al. .......... | 365/188 |
| 6,205,049 B1 | | 3/2001 | Lien et al. .................... | 365/154 |
| 6,377,084 B1 | | 4/2002 | Forbes .......................... | 327/55 |
| 6,534,805 B1 | | 3/2003 | Jin .............................. | 257/206 |
| 6,570,227 B2 | | 5/2003 | Rockett ....................... | 257/367 |
| 6,731,566 B1 | | 5/2004 | Sywyk et al. ........... | 365/230.05 |
| 6,762,638 B2 | | 7/2004 | Correale, Jr. et al. ........ | 327/202 |
| 6,798,704 B2 | | 9/2004 | Chen et al. .................. | 365/205 |
| 6,804,143 B1 | | 10/2004 | Hobson ........................ | 365/154 |
| 6,822,919 B2 | | 11/2004 | Sahoo ........................ | 365/208 |
| 6,849,958 B2 | | 2/2005 | Madurawe ................... | 257/903 |
| 6,853,578 B1 | | 2/2005 | Zhang et al. ................. | 365/154 |
| 7,088,607 B2 | | 8/2006 | Matsuzawa et al. ......... | 365/153 |
| 7,110,304 B1 | | 9/2006 | Yu et al. ................. | 365/189.02 |
| 7,116,358 B1 | | 10/2006 | Sasaki ....................... | 348/222.1 |
| 7,139,025 B1 | | 11/2006 | Berezin ....................... | 348/308 |
| 7,158,403 B2 | | 1/2007 | Schmitt ........................ | 365/154 |
| 2002/0020886 A1 | | 2/2002 | Rockett ........................ | 257/369 |
| 2004/0007743 A1 | | 1/2004 | Matsuda et al. ............. | 257/369 |
| 2006/0245266 A1 | | 11/2006 | Sahara et al. .......... | 365/189.01 |

* cited by examiner

*Primary Examiner*—Tuan T Nguyen
*Assistant Examiner*—Alexander Sofocleous
(74) *Attorney, Agent, or Firm*—Kramer Levin Naftalis & Frankel LLP

(57) ABSTRACT

A static random access memory (SRAM) cell having an inverter and a tri-state inverter. An input of the inverter is coupled to an output of the tri-state inverter and an output of the inverter is coupled to an input of the tri-state inverter. The tri-state inverter has an enable node to which a read signal is applied and is configured to generate an output signal that is the complement of an input signal in response to an active read signal. The SRAM cell further includes an access transistor having a first node coupled to the output of the tri-state inverter and having a second node coupled to the digit line. The access transistor is configured to couple the first and second nodes in response to an active access signal applied to its gate.

25 Claims, 6 Drawing Sheets

STATIC RANDOM ACCESS MEMORY CELL

CROSS-REFERENCE TO RELATED APPLICATION

This application is a divisional of pending U.S. patent application Ser. No. 11/113,365, filed Apr. 21, 2005.

TECHNICAL FIELD

This invention relates generally to semiconductor memory cells, and more particularly, to a static random access memory cell that is resistant to inadvertently switching data states during operation.

BACKGROUND OF THE INVENTION

Static random access memories (SRAMs) are sometimes used in preference to dynamic random access memories (DRAMs) because SRAMs have faster access times compared to DRAMs and do not need to be periodically "refreshed" to maintain a data state. Additionally, as will be explained in more detail below, data is typically stored by a SRAM cell by latching the data state. Since very little power is required to maintain a latched state, SRAM cells can be made to have very low power consumption.

FIG. 1 is a circuit diagram of a conventional 6-transistor (6T) SRAM cell 100. A pair of NMOS access transistors 112 and 114 allow complementary bit values D and /D on digit lines 116 and 118, respectively, to be read from and to be written to a storage circuit 120 of the SRAM cell 100. The storage circuit 120 includes NMOS pull-down transistors 122 and 126, which are coupled in a positive-feedback configuration with PMOS pull-up transistors 124 and 128. The SRAM cell 100 is bistable, that is, the SRAM cell 100 can have one of two stable data states, logic 1 or logic 0. Nodes A and B are the complementary inputs/outputs of the storage circuit 120, and the respective complementary logic values at these nodes represent the data state of the SRAM cell 100. For example, when the node A is at logic 1 and the node B is at logic 0, then the SRAM cell 100 is storing a logic 1. Conversely, when the node A is at logic 0 and the node B is at logic 1, then the SRAM cell 100 is storing a logic 0.

In operation, prior to a read operation, the digit lines 116 and 118 are equilibrated to approximately VDD. During a read of the SRAM cell 100, a word-line WL, which is coupled to the gates of the transistors 112 and 114, is driven to a voltage approximately equal to VDD to activate the transistors 112 and 114. By way of example, the voltage of VDD and a logic "1" is five volts and the voltage of VSS and a logic "0" is zero volts. Assuming that at the beginning of the read the SRAM cell 100 is storing a logic 0, the voltage level at the node A is 0 volts and the voltage level at the node B is 5 volts. In response to driving the WL to VDD, the NMOS transistor 112 couples the node A to the digit line 116, and the NMOS transistor 114 couples the node B to the digit line 118. Coupling the digit line 116 to the node A through the NMOS transistor 112 pulls down the voltage on the digit line 116 (e.g., 100-500 millivolts) to cause a sense amp (not shown) coupled to the digit lines 116 and 118 to read the SRAM cell 100 as storing a logic 0.

In operation during a write operation, for example, of a logic 1 to the SRAM cell 100, the WL is driven to a voltage approximately equal to VDD and the transistors 112 and 114 are activated as discussed above. The logic 1 is driven onto the digit line 116 and a logic 0 is driven onto the digit line 118. The transistor 112 couples the voltage of the digit line 116 to the node A, and the transistor 114 couples 0 volts from the digit line 118 to the node B. The low voltage on the node B turns OFF the NMOS transistor 126, and turns ON the PMOS transistor 128. As a result, the inactive NMOS transistor 126 allows the PMOS transistor 128 to pull the node A up to VDD. The voltage on the node A turns ON the NMOS transistor 122 and turns OFF the PMOS transistor 124, thus, allowing the NMOS transistor 122 to reinforce the logic 0 on the node B. Additionally, the VDD voltage coupled to the node A and the 0 volts coupled to the node B ensure that through the positive-feedback configuration the SRAM cell 100 will store a logic 1.

As previously discussed, reading data from a conventional SRAM cell and writing data to the SRAM cell work by activating opposing transistors of a pair of cross-coupled CMOS inverters. In the event the actual transistor characteristics of the NMOS 122, 126 or the PMOS 124, 128 deviate from expected transistor characteristics, the stability margin of the SRAM cell can be affected. Such shifts in transistor characteristics can be caused by different reasons, one of which is by process variations that occur during fabrication of the SRAM cells. If the actual transistor characteristics shift significantly enough, the SRAM cell can become monostable or read unstable instead of bistable.

A SRAM cell is monostable when it can store only one logic state instead of two logic states when the access transistors are in the OFF state. More specifically, with reference to FIG. 1, offset currents, typically on the order of picoamps (pA), often flow from the nodes A and B. These offset currents can be due to leakage currents, sub-threshold currents, or both, generated by the six transistors of the SRAM cell 100 when they are in an OFF state. To prevent these offset currents from causing the SRAM cell 100 to spontaneously change states, the PMOS transistors 124, 128 when ON must be able to provide currents that flow from VDD to the nodes A and B that are greater than or equal to these respective offset currents. For example, assume that the SRAM cell 100 is initially storing a logic 1 such that the voltage at the node A is approximately 5 volts and the voltage at the node B is approximately 0 volts, and that the total offset current drawn from the node A is 10 pA. If the PMOS transistor 128 allows only 5 pA to flow from VDD to the node A when ON due to a shift in its transistor characteristics, then the larger offset current will gradually discharge the parasitic capacitance (not shown) associated with the node A. Consequently, the voltage at the node A is lowered until the transistor 122 turns OFF. If the current through the PMOS transistor 124 is greater than the offset current drawn from the node B, then the voltage at the node B gradually increases until the transistor 126 turns ON and pulls the node A to zero volts. As a result, the SRAM cell 100 has only one stable state, that is, logic 0, when the access transistors 112 and 114 are OFF. Thus, even if a logic 1 is written, the SRAM cell 100 will eventually and spontaneously flip to a logic 0. Therefore, the SRAM cell 100 is monostable.

A SRAM cell is read unstable when the SRAM cell has only one stable logic state when the access transistors 112 and 114 are ON, as they are during a read operation. As a result, the SRAM cell 100 may be able to stably store a logic 1 or logic 0 that is written to it, but when the access transistors 112 and 114 are activated during a read (when there are no write voltages driven onto the digit lines 116 and 118), the SRAM cell 100 becomes read-monostable. If the logic state last written to the SRAM cell 100 is opposite the read-monostable state, then the SRAM cell 100 will spontaneously flip states and the incorrect data state will be read.

Therefore, there is a need for an alternative SRAM cell design that is more resilient than conventional SRAM cells to inadvertent bit flipping, such as monostability and read instability.

SUMMARY OF THE INVENTION

The present invention is directed to a static random access memory (SRAM) cell. In one aspect of the invention the SRAM cell includes a latch having an inverter and a tri-state inverter. An input of the inverter is coupled to an output of the tri-state inverter and an output of the inverter is coupled to an input of the tri-state inverter. The tri-state inverter has an enable node to which a read signal is applied and is configured to generate an output signal that is the complement of an input signal in response to an active read signal. The SRAM cell further includes an access transistor having a first node coupled to the output of the tri-state inverter and having a second node coupled to a digit line. The access transistor is configured to couple the first and second nodes in response to an active access signal applied to its gate. In another aspect of the invention, a differential read data signal can be provided by having a second access transistor to selectively couple the output of the inverter to a second digit line. Another aspect of the invention is a method for writing data to a static random access memory (SRAM) cell having first and second inverters. The method includes disabling the first inverter and coupling write data to the second inverter. The write data is decoupled from the second inverter and the first inverter is enabled to latch the write data with the second inverter.

DETAILED DESCRIPTION OF PREFERRED EMBODIMENTS

Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
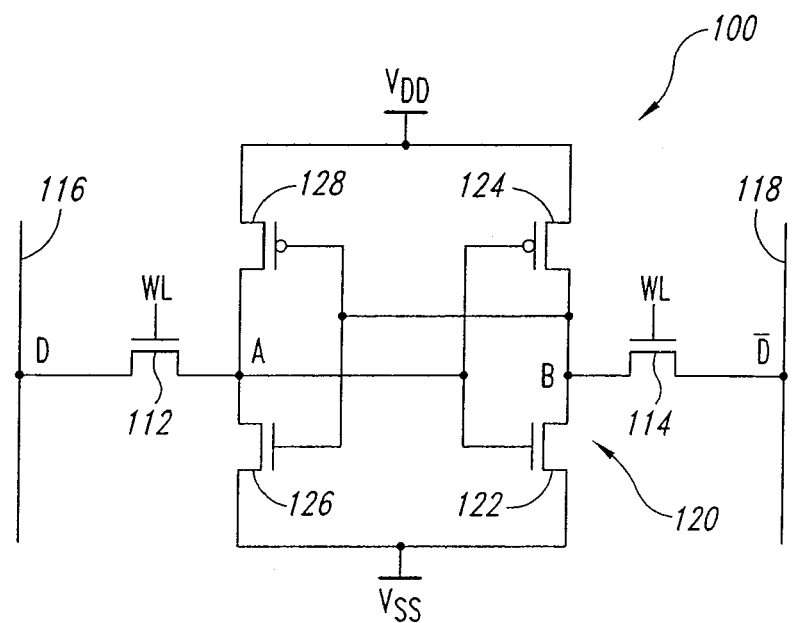
FIG. 1 is a schematic drawing of a conventional six-transistor (6T) static random access memory (SRAM) cell.
Figure 2A:
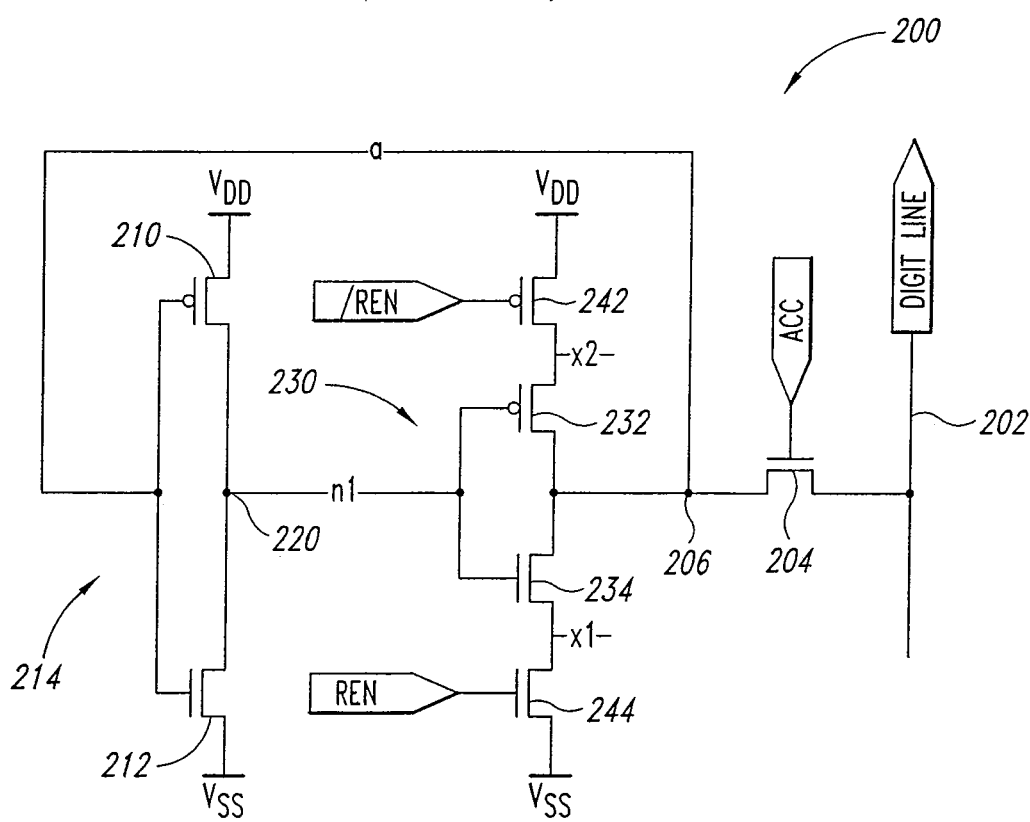
FIG. 2A is a schematic drawing of a SRAM cell according to an embodiment of the present invention.

FIG. 2A illustrates a static random access memory (SRAM) cell 200 according to an embodiment of the present invention. The SRAM cell 200 is shown coupled to a digit line 202 that is in turn coupled to a sense amplifier (not shown) that senses the voltage of the digit line 202 in response to accessing the SRAM cell 200 through an access transistor 204. The memory cell 200 can be used with conventional sense amplifiers known in the art, including single ended sense amplifiers as well as differential sense amplifiers. The access transistor 204 couples a node 206 to the digit line 202 in response to an active access signal ACC. The node 206 is coupled to an input of a first complementary metal-oxide semiconductor (CMOS) inverter 214 that includes a p-channel metal-oxide semiconductor (PMOS) transistor 210 and an n-channel metal-oxide semiconductor (NMOS) transistor 212. An output of the inverter 214, represented by a node 220, is coupled to an input of a second CMOS inverter 230 that includes PMOS transistor 232 and NMOS transistor 234. The CMOS inverter 230 is coupled to a voltage supply VDD and VSS (typically ground) through transistors 242 and 244, respectively. As shown in FIG. 2A, the transistors 242 and 244 are PMOS transistors and NMOS transistors, respectively. However, other transistors or switches can be used as well. As will be explained in more detail below, an active high read enable signal REN and an active low /REN signal are used to read and write the memory cell 200, in combination with the ACC signal.

As previously discussed, the transistor characteristics of the transistors of a conventional 6T SRAM cell can sufficiently change due to process shifts to cause the SRAM cell to monostable. For example, the data state of the SRAM cell may inadvertently flip, changing the stored data state, or only one data state can be read from the SRAM cell regardless of what data state has been written. In either case, the result is erroneous data. As will be explained in more detail below, the operation of the memory cell 200 is not as dependent on transistor performance as a conventional SRAM cell. As a result, the memory cell 200 is resistant to inadvertently changing data states. Moreover, the issue of write contention, which is related to the operation of conventional SRAM cells, is avoided during a write operation with an SRAM cell according to an embodiment of the present invention.

In operation, data is written to the memory cell 200 by applying a /REN signal having a HIGH logic level to the transistor 242 and a REN signal having a LOW logic level to the transistor 244, and activating the access transistor 204 to couple the node 206 to the digit line 202. As used herein, the terms HIGH logic level and LOW logic level refer to a voltage level that corresponds to VDD and VSS, respectively. More generally, however, a HIGH logic level is sufficient to cause an NMOS transistor to be conductive and a PMOS transistor to be non-conductive, and a LOW logic level is sufficient to cause the NMOS transistor to be non-conductive and the PMOS transistor to be conductive.

As a result of the HIGH /REN signal and the LOW REN signal, the voltage level of the digit line 202 is coupled to the node 206 to write data to the memory cell 200. The inverter 214 responds to the voltage of the digit line 202 by coupling the node 220 to either the voltage supply VDD or to VSS. More specifically, the voltage of the digit line being greater than the threshold voltage VTN of the NMOS transistor 212, the NMOS transistor 212 is conductive and couples the node 220 to VSS while the PMOS transistor 210 is non-conductive. Where the voltage of the digit line is greater than the threshold voltage VTP of the PMOS transistor, the PMOS transistor 210 is conductive and couples the node 220 to the voltage supply VDD while the NMOS transistor 212 is non-conductive. With the transistors 242 and 244 non-conductive in response to the HIGH /REN signal and the LOW REN signal, respectively, the output of the inverter 230 at the node 206 is not coupled to either the voltage supply VDD or VSS, but only to the digit line 202. As a result, the output of the inverter 214 does not cause the output of the inverter 230 to change.

The write operation is completed by deactivating the access transistor 204 to decouple the node 206 from the digit line 202, and switching the logic levels of the REN and /REN signals to HIGH and LOW, respectively, to enable the inverter 230. Due to the capacitance of the MOS transistors of the memory cell 200, the voltage at the node 220 will be sufficient to maintain the conductive state of the PMOS transistor 232 or NMOS transistor 234 during the time between when the access transistor 204 is deactivated and when the LOW /REN and HIGH REN signals are applied to the transistors 242 and 244 respectively. When the transistors 242 and 244 become conductive in response to the LOW /REN and HIGH REN signals, the data state that was written to the memory cell 200 will be latched and stored at the node 206. Since there is not a current path from the digit line 202 to either the voltage supply VDD or VSS during the write operation, since the transistors 242 and 244 are both non-conductive due to the HIGH /REN signal and the LOW REN signal, the previously discussed issue of write contention for conventional 6T SRAM cells is avoided. That is, the memory cell 200 will capture a data state of a write operation after a settling time without the need for the voltage of the digit line 202 to be sufficient to overcome the latched data state of a conventional 6T SRAM cell.

In preparation for a read operation to the memory cell 200, the digit line 202 is precharged to a precharge voltage, as known in the art. Preferably, the precharge voltage is greater than 1.2 volts where the magnitude of VDD is approximately 1.7 volts. To read data from the memory cell 200, an active ACC signal is applied to the access transistor 204 to couple the node 206 to the digit line 202, and a HIGH REN signal and a LOW /REN signal are applied to the transistors 244 and 242, respectively. As previously discussed, a data state is latched by the memory cell 200 while a REN and /REN signals have a HIGH level and a LOW logic level, respectively. Thus, in response to the activation of the access transistor 204, the data state latched at the node 206 is coupled to the digit line 202 for sensing by a sense amplifier (not shown) that is coupled to the digit line 202. The memory cell 200 is resistant to being inadvertently flipping data states during a read operation because the access transistor 204 operates as a VDD source follower and the pair of PMOS transistors 242 and 232, or NMOS transistors 234 and 244, operate as a current mirror in deep linear region. Most of the voltage difference between the digit line 202 and the node 206 will be due to a drain-source voltage drop across the access transistor 204. Consequently, the memory cell 200 is resistant to being inadvertently flipping during a read operation.

Additionally, since write contention is avoided during a write operation to the memory cell 200, an array of memory cells 200 can be easily reset to a known data state by activating the access transistors 204 for all of the memory cells 200, and writing the known data to all of the memory cells through the respective digit lines 202. Since data is written to the memory cells 200 without overcoming write contention, simple sense amplifiers can provide sufficient drive to write to an entire column of memory cells.

Figure 2B:
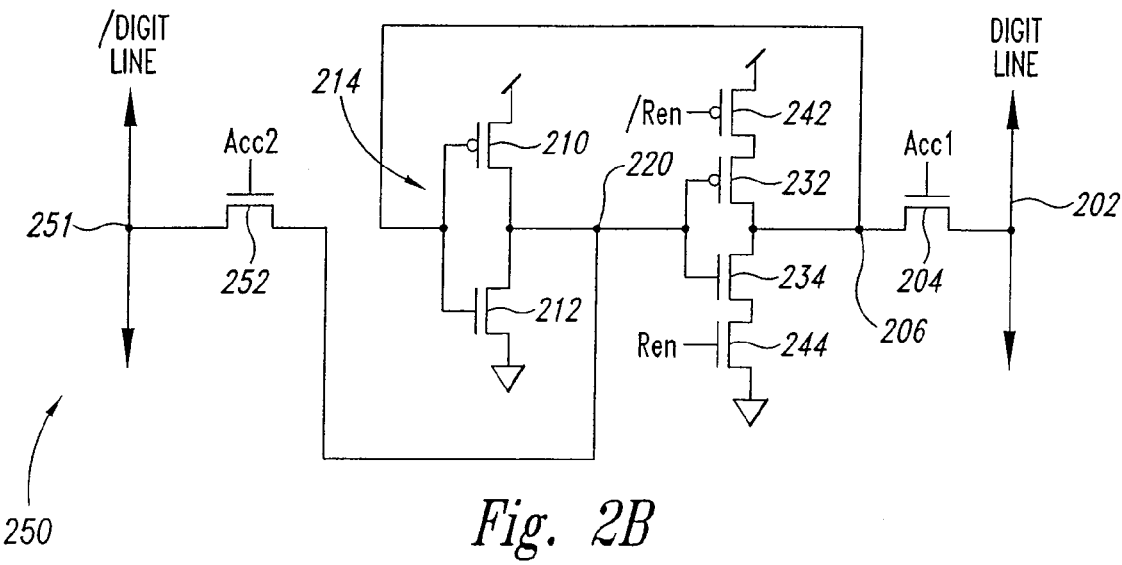
FIG. 2B is a schematic drawing of a SRAM cell according to another embodiment of the present invention.

FIG. 2B illustrates a SRAM cell 250 according to an alternative embodiment of the present invention. The same reference numbers have been used in FIG. 2B as in FIG. 2A to identify common elements. In many cases it is preferred to have differential data signals when reading from a memory cell due to the design and operation of typical sense amplifiers. The SRAM cell 250 can provide differential data signals on digit lines 202 and 251. The SRAM cell 250 is coupled to the pair of differential digit lines 202 and 251 through access transistors 204 and 252, respectively. The digit line 251 is coupled to a node 220 that represents an output of a CMOS inverter 214 having a PMOS transistor 210 and a NMOS transistor 212. The digit line 202 is coupled to a node 206 representing an output of a CMOS inverter having a PMOS transistor 232 and an NMOS transistor 234. The PMOS transistor 232 and NMOS transistor 234 are coupled to a supply voltage VDD and VSS through PMOS transistor 242 and NMOS transistor 244, all respectively. A read enable signal /REN and its complement REN are applied to the gates of the PMOS transistor 242 and the NMOS transistor 244, respectively.

In operation, data can be written to the SRAM cell 250 by forcing the access signal ACC2 and the REN signal LOW while the access signal ACC1 and the /REN signal are forced HIGH. Write data is provided to the SRAM cell 250 on digit line 202. In this condition, there is no contention in writing the new data because the transistors 242 and 244 are OFF, disabling the CMOS inverter having PMOS transistor 232 and the NMOS transistor 234, and decoupling the node 220 from the digit line 251. The write data coupled to the node 206 causes the CMOS inverter 214 having PMOS transistor 210 and NMOS transistor 212 to invert the write data and store the data at the node 220. When reading data from the SRAM cell 250, the ACC1, ACC2, and REN signals are forced HIGH, with the /REN signal forced LOW. Under this condition, the CMOS inverter having PMOS transistor 232 and NMOS transistor 234 is enabled, and the data state at the node 220 is latched as the inverted data state is provided to the node 206. The node 220, at which the data state is stored, is coupled to the digit line 251 and the inverted, that is, differential data state, is coupled to the digit line 202. The previously described read operation of reading data from the SRAM cell 250 is similar to a conventional 6T SRAM cell. However, a different read operation can be executed by forcing the /REN signal LOW and the REN and ACC2 signals HIGH to read data from only the digit line 251. In this read operation, the data state is fed back into a temporary dynamic storage node and results in reduced risk of having digit line impedance or leakage flip the data state while reading the data from the SRAM cell 250. As illustrated in the previous example, the SRAM cell 250 can provide differential data similar to a conventional 6T SRAM cell, but additionally provide reduced contention for writing data independent of process variations when the SRAM cell 250 is fabricated.

Figure 2C:
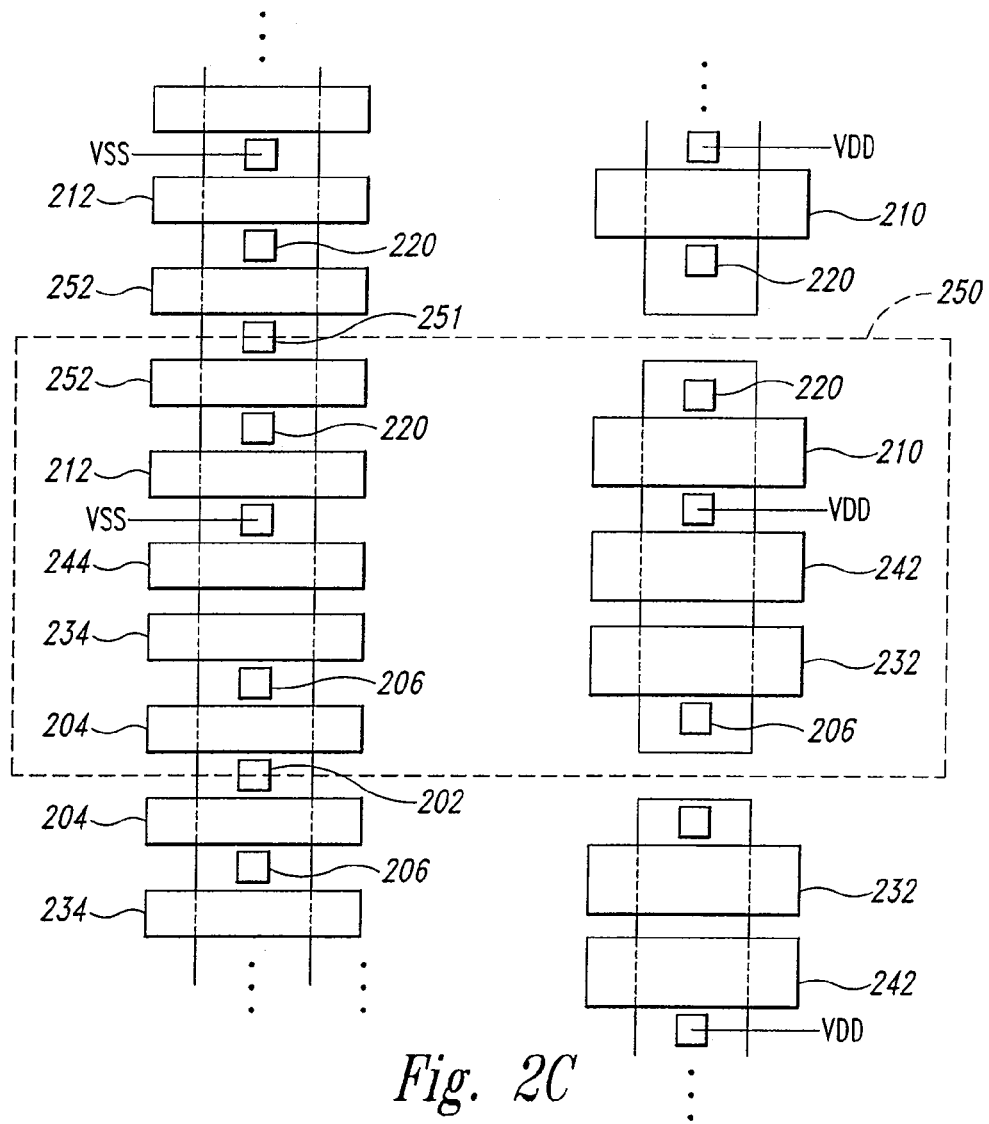
FIG. 2C is a layout for a SRAM cell according to an embodiment of the present invention.

FIG. 2C illustrates a layout according to an embodiment of the present invention of the SRAM cell 250. The SRAM cell 250 is outlined in FIG. 2C to illustrate the relative size and layout of the SRAM cell 250. Generally, p-channel transistors have minimum p-channel transistor lengths that are longer than minimum n-channel transistor lengths for n-channel transistors having the same current drive. The differential digit line active regions, representing the digit lines 202 and 251, are shared with the neighboring memory cells. For example, a contact representing the digit line 251 is shared with an adjacent SRAM cell, and a contact representing the digit line 202 is shared with an adjacent SRAM cell. As a result of sharing the digit line diffusion regions and having n-channel transistors with relatively shorter transistor lengths (compared to the use of p-channel transistors), the active area for the layout of the SRAM cell 250 ends up being a continuous diffusion strip, as shown in FIG. 2C. Additionally, the large active area to active area spacing of conventional 6T SRAM cells is avoided. Due to these layout advantages, the SRAM cell 250, having eight transistors, occupies approximately the same layout area as the SRAM cell 200 (seven transistors) as well as conventional 6T SRAM cells.

Figure 3:
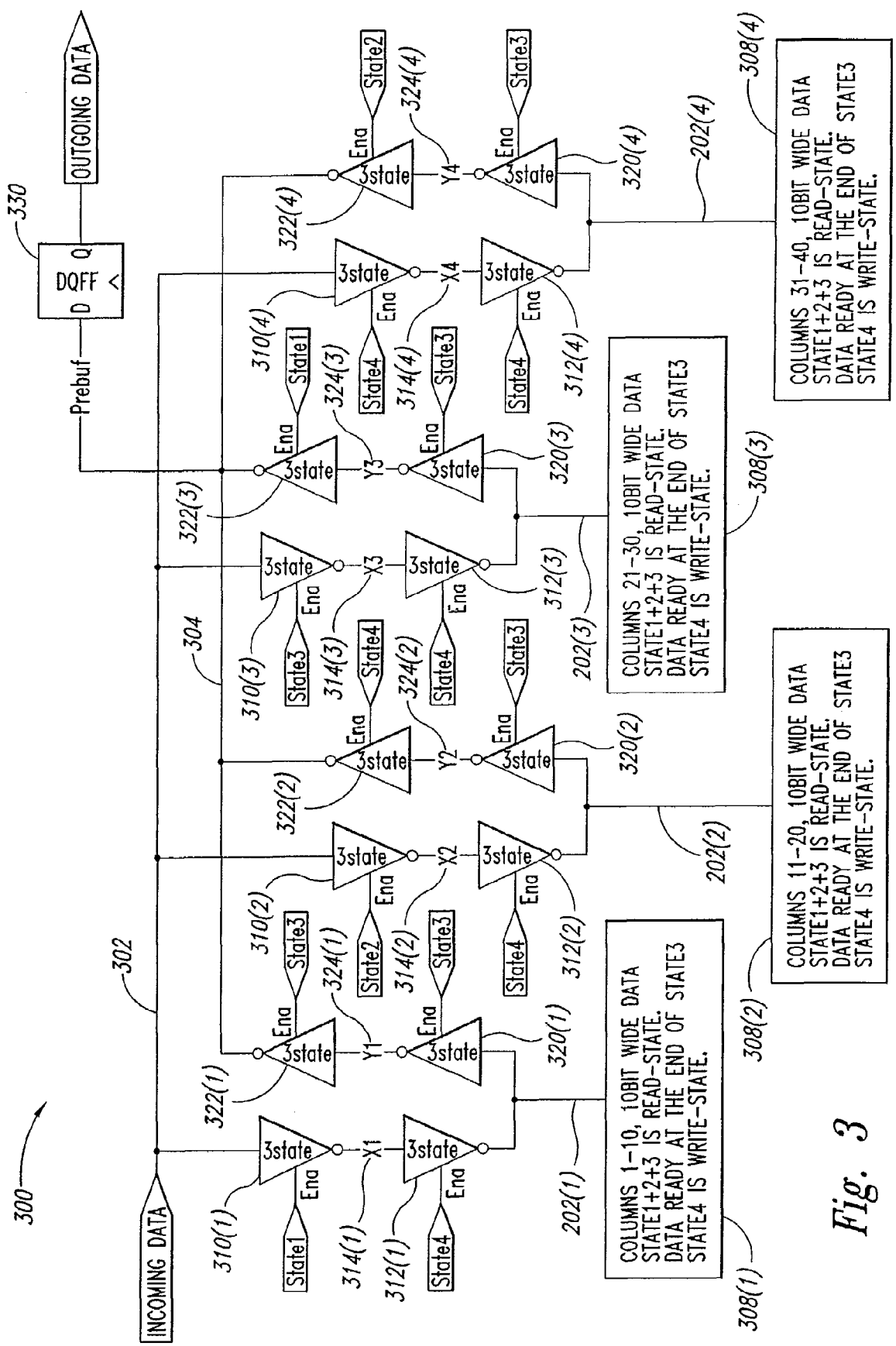
FIG. 3 is a functional block diagram of a set of sense amplifiers that can be used with the SRAM cells of FIG. 2A and FIG. 2B.

The memory cell 200 can be advantageously used in image sensors due to its low power operation and relatively low supply ripple. Additionally, with the operation of the memory cell 200 as previously described, a tri-state inverter or precharge inverter can be used as the sense amplifier since neither reading data from nor writing data to the cell requires significant current drive. FIG. 3 illustrates a set of sense amplifiers 300 that can be used with a plurality of memory cells 200, which are particularly suited for application in a pixel line delay for a image sensor, for example, a dual-port serial access memory (SAM) or a read-modify-write SAM. Generally, in this application, data stored by the memory cells 200 are read serially, with the amount of data for each "line" or "row" of data being equal to one another. Typically, while the data for a line of data is being read from the memory cells, new data will be provided that will be written to the same memory cells from which data is just read. The set of sense amplifiers 300 provide the ability to perform the "read-modify-write" operation for a row of memory cells.

The set of sense amplifiers 300 is illustrated in FIG. 3 for reading and writing a line of data that is 40-bits in length. A 10-bit wide shared input data bus 302 and a 10-bit wide shared output bus 304 are multiplexed between four sets of 10 columns of memory. Each column of memory includes a respective digit line 202 (FIG. 2A) to which memory cells 200 are coupled. When a row of memory is accessed, each column provides one bit of 10-bit wide data. The sets of 10 columns of memory, and the memory cells 200 coupled to the respective digit line 202, are represented in FIG. 3 by blocks 308. Each set of 10 columns 308 is coupled to the input data bus 302 and the output bus 304 by a set of 10 groups of tri-state inverters, represented in FIG. 3 by tri-state inverters 310, 312, 320, and 322. Each tri-state inverter is activated in response to a respective enable signal, as shown in FIG. 3. The 10-bits of data from each set is latched by an output data latch 330 that latches 10-bits of data and outputs the same in response to a clock signal. The functional block diagram of the set of sense amplifiers 300 has been simplified by omitting various circuits, for example, multiplexers, and reducing multi-bit busses to a single line in order to avoid obscuring explanation of its operation. However, it will be appreciated that those ordinarily skilled in the art will obtain sufficient understanding from the description provided herein to practice embodiments of the present invention.

The inverters 310 and 312 are coupled in series between the shared input data bus 302 and a respective set of the columns of memory 308 to provide write data to be written to the memory cells. The inverters 320 and 322 are coupled in series between a respective set of the columns of memory 308 and the shared output data bus 302 to provide read data to the output data latch 330. As will be explained in more detail below, appropriately timing the enable signals of the inverters 310, 312, 320, and 322, allows read data from each of the columns of memory 308(1)-308(4) to be coupled to the shared output data bus 304 at the appropriate times for the output data latch 330 to sequentially latch four sets of 10-bits of read data and sequentially output the four sets of 10-bit read data. Additionally, by coordinating the timing the enable signals of the inverters 310, 312 and the enable signals for the inverters 320, 322 during the time read data is being read from the columns of memory 308, sets of write data coupled to the shared input data bus 302 can be written to the columns of memory 308 of memory 308(1)-308(4) after the respective read data is provided to the output data bus 304.

Operation of the set of sense amplifiers 300 will be now explained with reference to FIGS. 3 and 4. The following describes a read operation performed on ROW0 of memory cells during times T0-T3. Additionally, during times T0-T3, write data is prepared to be written to the memory cells of ROW0. The inversion of data by the inverters 310, 312, 320, 322 will be ignored in the following example in order to simplify explanation of the operation of the sense amplifiers 300. As known in the art, since the inverters 310, 312 and 320, 322 are coupled in pairs between the respective data busses 302, 304, and the columns of memory 308, true data, being inverted twice through the pairs of inverters, are written to and read from the memory cells. By a time T4, the write data is written to the memory cells of ROW0.

At a time T0, an active enable signal STATE1 is applied to the inverter 310(1) to capture incoming write data "A" from the input data bus 302 at a node 314(1). The other enable signals STATE2, STATE3, and STATE4 are inactive, and consequently, the inverters other than 310(1) are disabled. The active STATE1 signal also activates the inverter 322(3) to couple read data latched at a node 324(3) to the output data bus 304. The read data coupled to the output data bus 304 at the time T0 is from a previous read operation and can be ignored in the present example. At a time T1, the STATE1 signal becomes inactive, and the incoming write data switches from A to "B." The STATE2 signal also becomes active at the time T1 to activate the inverter 310(2) and latch the incoming write data B at a node 314(2). The active STATE2 signal also enables the inverter 322(4) to couple the read data latched at a node 324(4) to the output data bus 304, which was previously coupled to the node 324(3). The read data coupled to the output data bus 304 at the time T1 is from a previous read operation and can be ignored in the present example.

At a time T2, the STATE2 signal becomes inactive to decouple the node 310(2) and the node 324(4) from the input data bus 302 and the output data bus 304, respectively. New write data "C" replaces the write data B, and the STATE3 signal becomes active to enable the inverter couple the write data C to a node 314(3). Additionally, the active STATE3 signal enables inverters 320(1)-320(4) to couple the memory cells of ROW0 for the columns of memory 308(1)-308(4) to respective nodes 324(1)-324(4). The read data is latched at the respective nodes 324(1)-324(4) in preparation for writing new data back to the memory cells of ROW0 for the columns of memory 308(1)-308(4). As shown in FIG. 4 by arrow 410, shortly after the STATE3 signal becomes active, read data An-1, Bn-1, Cn-1, and Dn-1 are provided from the columns of memory 308(1)-308(4), respectively. The read data An-1, Bn-1, Cn-1, and Dn-1 represent data that was stored in the memory cells of ROW0 prior to when the current ROW0 read operation was initiated. The active STATE3 signal further enables the inverter 322(1) to couple read data An-1 from the present ROW0 read operation to the output data bus 304. Although not shown in FIG. 4, the ACC signals, and the active REN and /REN signals are applied to the memory cells of ROW0 at a time prior to the time T2 in order to have the respective read data ready to be sensed and latched by the inverters 320(1)-320(4). As previously discussed, the REN and /REN signals are active to maintain the data state stored in the memory cell 200, and the ACC signal becomes active to couple the data state to the digit line 202.

At a time T3, the STATE3 signal becomes inactive, decoupling the nodes 324(1)-324(4) from the respective columns of memory 308(1)-308(4), and additionally, decoupling the node 314(3) from the input data bus 302 and the node 324(1) from the output data bus 304. The incoming write data is switched from C to new incoming write data "D." The STATE4 signal becomes active to enable the inverter 310(4) to latch inverted incoming write data D at a node 314(4) and further enable the inverter 322(2) to couple read data Bn-1 (latched in response to the active STATE3 signal at the time T2) to the output data bus 304. The active STATE4 signal also enables the inverters 312 (1)-312(4) to couple the nodes 314 (1)-314(4) to the columns of memory 308(1)-308(4) to write the respective incoming write data A, B, C, and D to the memory cells of ROW0. During the time the inverters 312 (1)-312(4) are enabled, the REN and /REN signals applied to the memory cells of ROW0 are inactive to allow a data state to be written. The ACC signal, which became active in the first place to allow data to be read from the memory cells of ROW0, remains active during the time the incoming write data is written to the memory cells of ROW0.

Figure 4:
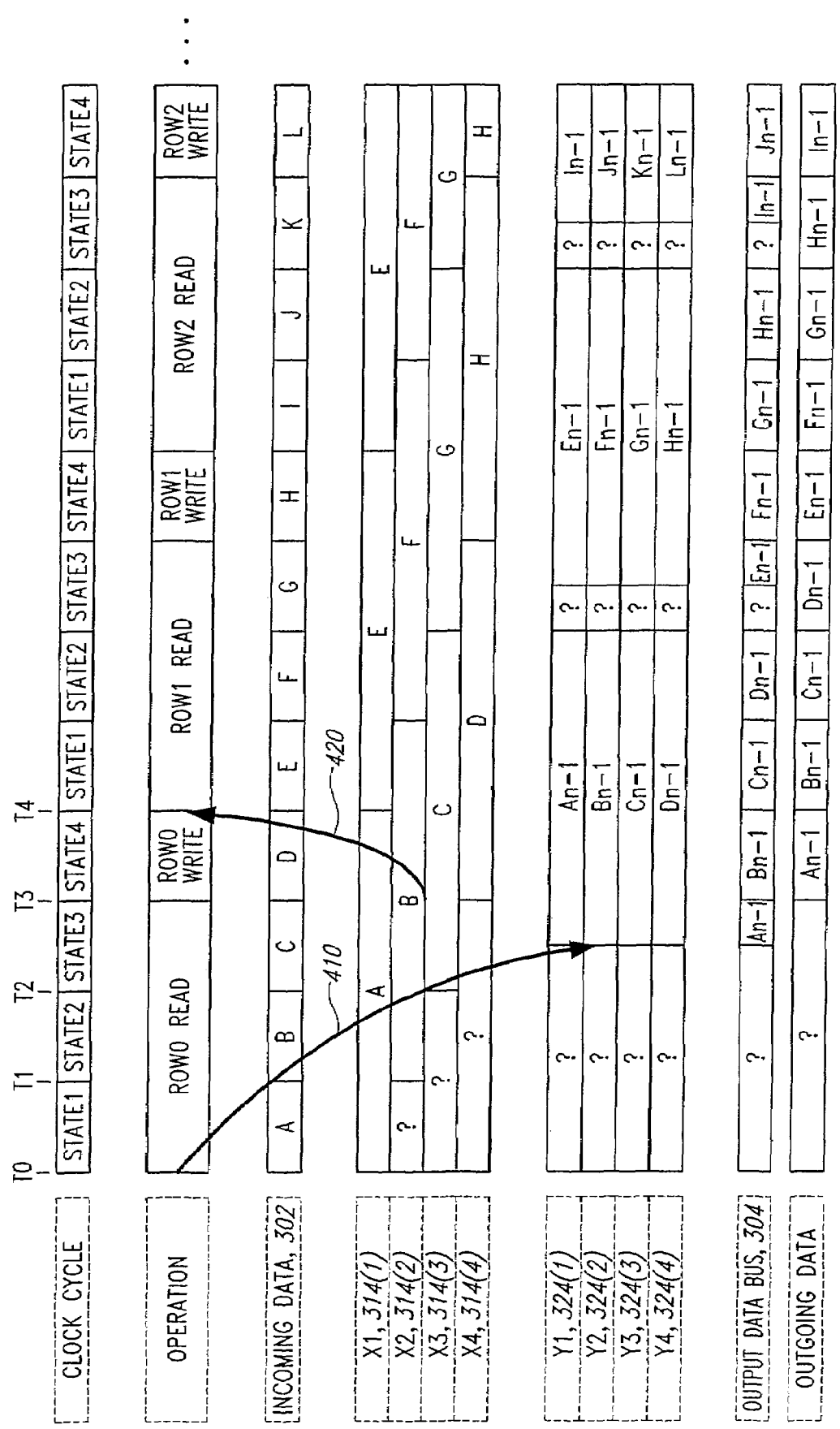
FIG. 4 is a timing diagram illustrating various states of operation for the SRAM cell of FIG. 2A with the set sense amplifiers of FIG. 3.

As shown in FIG. 4 by arrow 420, after the incoming write data D is latched from the input data bus 302 at the time T3, all of the data A, B, C, and D are written to the memory cells of ROW0 for the columns of memory 308(1)-308(4) by a time T4, which also represents the beginning of the next read operation of reading data from ROW1. The read operation for the memory cells of ROW1 proceeds in the same manner as the read operation for the memory cells of ROW0, as previously described. That is, by timing the STATE1-STATE4 signals accordingly, after read data En-1, Fn-1, Gn-1, and Hn-1 are latched from the columns of memory 308(1)-308(4), respectively, incoming write data E, F, G, and H are written to the columns of memory 308(1)-308(4), respectively. Thus, as previously described, a read-modify-write operation to the memory cells of a row of memory can be executed.

Figure 5:
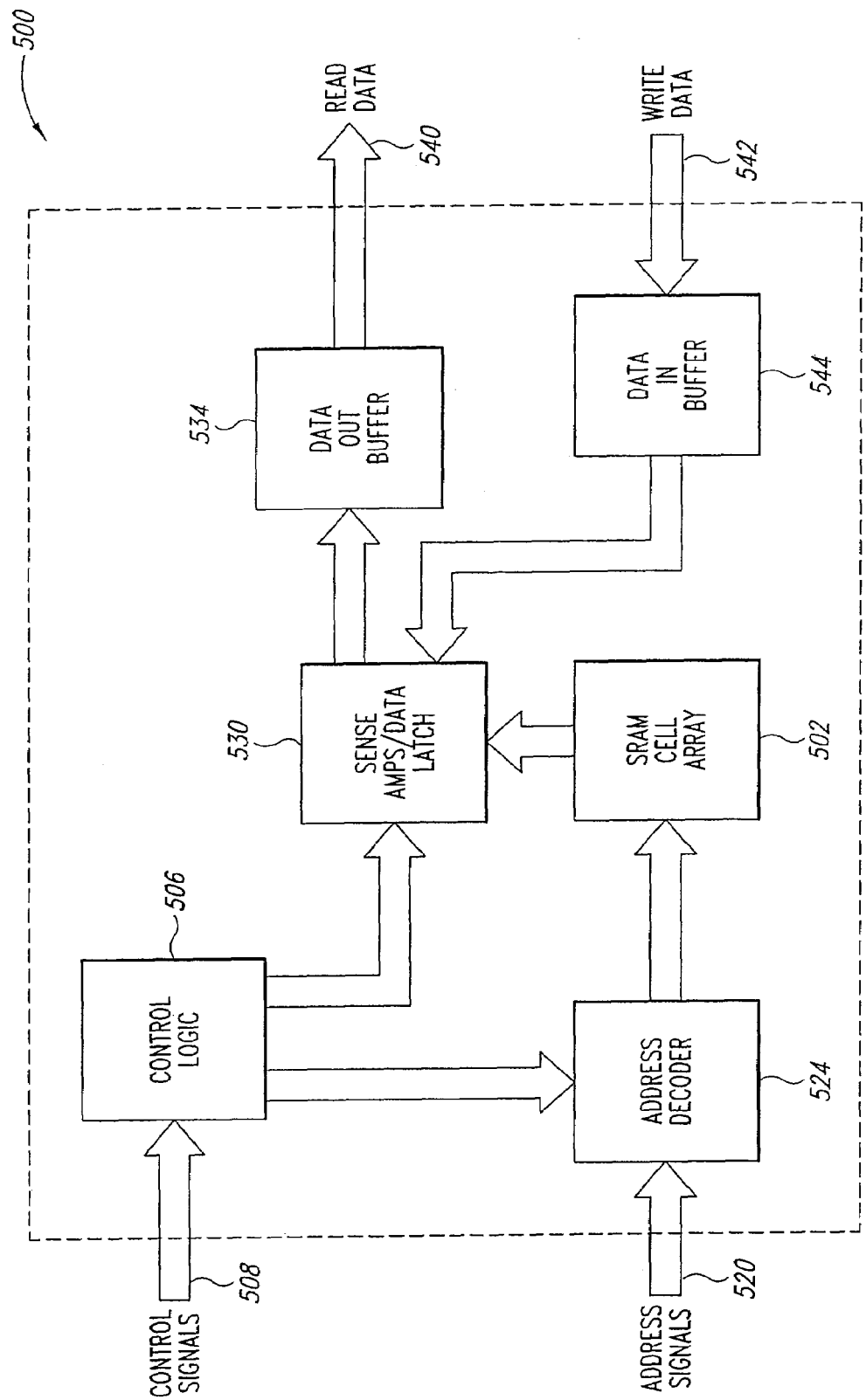
FIG. 5 is a functional block diagram of a dual-port memory that includes one or more SRAM cells according to an embodiment of the present invention.

FIG. 5 illustrates a dual-port memory 500 having a memory array 502 of SRAM cells according to an embodiment of the present invention. The dual-port memory 500 includes control logic 506 that receives command signals through a command bus 508. In response to the command signals, the control logic 506 generates corresponding internal control signals for a memory decoder 524 and sense amplifiers and data latches 530 to execute the memory commands. Memory address signals are provided to the memory address decoder 524 through a memory address bus 520. The memory address signals correspond to memory locations in the memory array 502 to which data is written or from which data is read. The memory address decoder 524 generates the appropriate decode signals to select the SRAM cells in the memory array 502 corresponding to the memory address. Alternatively to the address 520 and the address decoder 524, a serial shift register can be used to sequentially select the rows. This will be acceptable in an application of a SAM (sequential access memory), which are used abundantly in imaging for pixel line delays. The sense amplifiers and data latches 530 are coupled to the memory array 502 for sensing read data stored in the SRAM cells as well as writing write data to the SRAM cells. Internal control signals generated by the control logic 506 in response to the command signals are used to control the activation and operation of the sense amplifiers and data latches 530. Read data sensed and latched by the sense amplifiers and data latches 530 are coupled to a data output buffer 534, which drives the read data onto an output data bus 540. Write data applied to the dual-port memory 500 on an data input bus 542 are coupled to a data input buffer 544, and then provided to the sense amplifiers and data latches 530 to be written to the SRAM cells of the memory array 502. In an alternative embodiment, the sense amplifiers 300 are used for the sense amplifiers and data latches 530, and the control logic 506 generates the internal control and timing signals for operating the sense amplifiers 300 as previously described.

Figure 6:
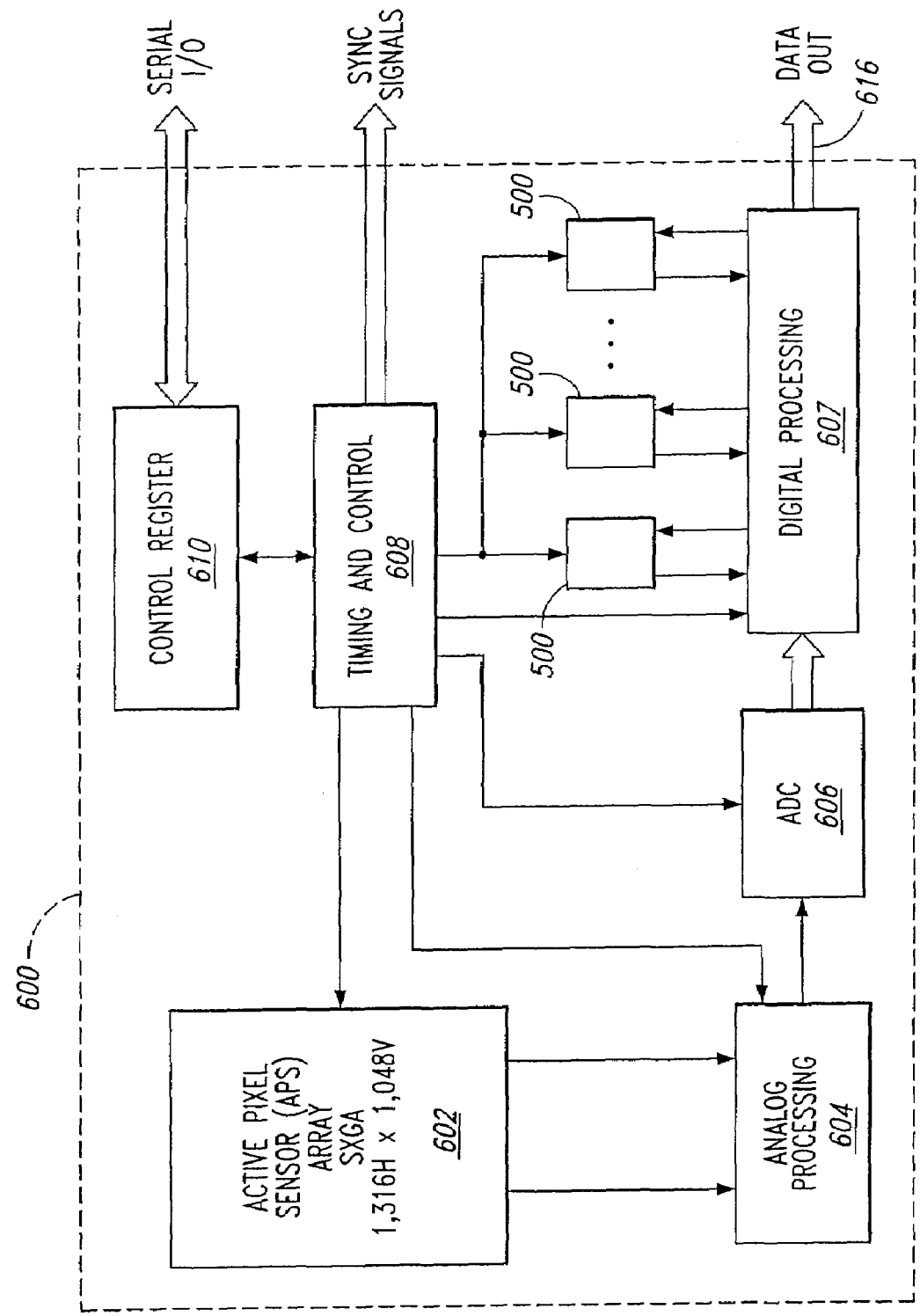
FIG. 6 is a functional block diagram of an image sensor including a dual-port memory having one or more SRAM cells according to an embodiment of the present invention

FIG. 6 is a block diagram of a image sensor 600 including the dual-port memory 500 of FIG. 5. The image sensor includes a CMOS active pixel sensor 602 which is used to capture images by capturing and reading light impinging the surface of the sensor 602. Output signals corresponding to the pixels of the sensor 602 are generated in response to the captured light and provided to an analog processing stage 604. The digital processing stage 607 performs various signal processing on the output signals received from the sensor 602, such as noise filtering, interpolation, defect correction, de-mosaic processing, compression, and the like. The dual-port memory 500 is utilized by the digital processing stage 607 during the processing operations, typically as a pixel line delay or line buffer.

An analog-to-digital converter (ADC) 606 is coupled to the analog processing stage 604 and digitizes the output signals resulting from the analog processing. A timing and control circuit 608 generates internal control signals to coordinate the operation of the image sensor 602, analog processing stage 604, the ADC 606, and digital processing 607 to provide digital image to a data output bus 616 in synchronicity with a synchronization signal generated by the timing and control circuit 608. The synchronization signal is provided on a synchronization signal bus 618. A control register 620 coupled to the timing and control circuit 608 can be accessed through a serial input/output bus 620 and can be programmed with commands to set operating modes and operating parameters of the image sensor 600. The control register 620 can be further accessed to obtain various status and device information, such as device version.

It will be further appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory comprising:
 a sense amplifier comprising a first plurality of tri-state inverters configured to couple a digit line to an input bus and a second plurality of tri-state inverters configured to couple the digit line to an output bus; and
 a memory cell coupled to the digit line, comprising:
 a first inverter having a first supply terminal coupled to a voltage supply and a first ground terminal coupled to ground, and further having a first input and a first output, the first inverter configured to generate a first output signal at the first output that is the complement of a first input signal in response to receiving the first input signal at the first input;
 a second inverter having a second supply terminal and a second ground terminal, and further having a second input coupled to the first output and a second output coupled to the first input, the second inverter configured to generate a second output signal at the second output that is the complement of the first output signal in response to a supply voltage coupled to the second supply terminal and ground coupled to the second ground terminal;
 a first switch having a first node coupled to the voltage supply and a second node coupled to the second supply terminal and further having a control node to which a first read signal is applied, the first switch configured to couple the first and second nodes in response to an active first read signal;

a second switch having a first node coupled to the second ground terminal and a second node coupled to ground and further having a control node to which a second read signal is applied, the second switch configured to couple the first and second nodes in response to an active second read signal; and an access transistor having a first node coupled to the second output, a second node coupled to the digit line, and a control node to which an access signal is applied, the access transistor configured to couple the first and second nodes in response to an active access signal.

2. The memory of claim 1 wherein the first switch comprises a p-channel metal-oxide-semiconductor (PMOS) transistor and wherein the second switch comprises a n-channel metal-oxide-semiconductor (NMOS) transistor.

3. The memory of claim 1 wherein the first inverter comprises a complementary metal-oxide-semiconductor (CMOS) inverter.

4. The memory of claim 1 wherein the first switch comprises a p-channel metal-oxide-semiconductor (PMOS) transistor having a gate to which the first read signal is applied.

5. The memory of claim 1 wherein the second switch comprises a n-channel metal-oxide-semiconductor (NMOS) transistor having a gate to which the second read signal is applied.

6. The memory of claim 1 wherein the access transistor comprises a n-channel metal-oxide-semiconductor (NMOS) transistor having a gate to which the access signal is applied.

7. The memory of claim 1 wherein the first read signal comprises a signal that is the complement of the second read signal.

8. A memory comprising:

a sense amplifier comprising a first tri-state inverter configured to couple a digit line to an input bus and a second tri-state inverter configured to couple the digit line to an output bus; and a memory cell, comprising:

a first inverter having a supply terminal coupled to a voltage supply and a first ground terminal coupled to ground, the first inverter having a first input and a first output, the first inverter operable to generate a first output signal;

a second inverter having a second supply terminal and a second ground terminal, the second inverter having a second input coupled to the first output of the first inverter and a second output coupled to the first input of the first inverter, the second inverter operable to generate a second output signal;

a first switch coupled to the voltage supply and the second supply terminal, the first switch operable to couple the voltage supply to the second supply terminal responsive to an active first read signal;

a second switch coupled to ground and the second ground terminal, the second switch operable to couple ground to the second ground terminal responsive to an active second read signal; and an access switch coupled to the second output of the second inverter and coupled to the digit line.

9. The memory of claim 8 wherein the first switch comprises a p-channel metal-oxide-semiconductor (PMOS) transistor and the second switch comprises an n-channel metal-oxide-semiconductor (NMOS) transistor.

10. The memory of claim 9 wherein the PMOS transistor comprises a gate to which the first read signal is applied and the NMOS transistor comprises a gate to which the second read signal is applied.

11. The memory of claim 8 wherein the access switch comprises a gate that provides access to the SRAM cell.

12. The memory of claim 8 the access switch comprises a n-channel metal-oxide-semiconductor (NMOS) transistor having a gate to which the switch signal is applied.

13. The memory of claim 8 wherein the second inverter comprises a complementary metal-oxide-semiconductor (CMOS) inverter coupled to a voltage supply and ground.

14. A method of reading data from a static random access memory cell formed by a pair of cross-coupled inverters, the method comprising:

coupling an output node of one of the cross-coupled inverters to a digit line in response to a signal;

selectively enabling one of the cross-coupled inverters by selectively applying power to the inverter;

enabling a first tri-state inverter to couple the digit line to an intermediate node; and enabling a second tri-state inverter to couple the intermediate node to an output bus.

15. The method of claim 14 wherein selectively enabling one of the cross-coupled inverters comprises applying an active high logic level to a first switch and an active low logic level to a second switch.

16. The method of claim 14 wherein coupling the output node to the digit line couples a data state latched at the output node to the digit line.

17. A memory comprising:

an array of static random access memory (SRAM) cells, comprising:

a plurality of digit lines;

a plurality of memory cells, each memory cell comprising:

a first inverter having a supply terminal coupled to a voltage supply and a first ground terminal coupled to ground, the first inverter having a first input and a first output, the first inverter operable to generate a first output signal;

a second inverter having a second supply terminal and a second ground terminal, the second inverter having a second input coupled to the first output of the first inverter and a second output coupled to the first input of the first inverter, the second inverter operable to generate a second output signal;

a first switch coupled to the voltage supply and the second supply terminal, the first switch operable to couple the voltage supply to the second supply terminal responsive to an active first read signal;

a second switch coupled to ground and the second ground terminal, the second switch operable to couple ground to the second ground terminal responsive to an active second read signal; and an access switch coupled to the second output of the second inverter and coupled to the digit line; and a plurality of sense amplifiers, each sense amplifier comprising a first plurality of tri-state inverters configured to couple a respective one of the plurality of digit lines digit line to an input bus and a second plurality of tri-state inverters configured to couple the respective digit line to an output bus.

18. The memory of claim 17 further comprising a plurality of word lines coupled to the plurality of digit lines.

19. The memory of claim 17 wherein the active first read signal comprises an active high read enable signal and the active second read signal comprises an active low read enable signal.

20. The memory of claim 17 wherein the first inverter comprises a complementary metal-oxide-semiconductor (CMOS) inverter.

21. The memory of claim 17 wherein the first switch comprises a p-channel metal-oxide-semiconductor (PMOS) transistor having a gate to which the first read signal is applied and the second switch comprises an n-channel metal-oxide-semiconductor (NMOS) transistor having a gate to which the second read signal is applied.

22. The memory of claim 19 wherein the second switch comprises a n-channel metal-oxide-semiconductor (NMOS) transistor having a gate to which the access signal is applied.

23. A memory comprising:
at least one sense amplifier comprising a first plurality of tri-state inverters configured to couple a digit line to an input bus and a second plurality of tri-state inverters configured to couple the digit line to an output bus; and
a static random access memory cell coupled to at least one of the sense amplifiers, comprising:
an inverter;
a tri-state inverter cross coupled to the inverter;
an access transistor coupled to the tri-state inverter and the digit line; and
a control circuit selectively placing the tri-state inverter in tri-state condition responsive to a control signal.

24. The memory of claim 23 wherein the control circuit uses a read signal as the control signal.

25. The memory of claim 23 wherein the tri-state inverter generates an output signal in response to the control signal.

* * * * *